United States Patent
Adachi (10) Patent No.: US 8,193,862 B2
(45) Date of Patent: Jun. 5, 2012

(54) OPERATIONAL AMPLIFIER

(75) Inventor: Koichiro Adachi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/872,239

(22) Filed: Aug. 31, 2010

(65) Prior Publication Data

US 2011/0063036 A1   Mar. 17, 2011

(30) Foreign Application Priority Data

Sep. 11, 2009   (JP) .................................. 2009-210671

(51) Int. Cl.
*H03F 3/45* (2006.01)
(52) U.S. Cl. ........................................ 330/255; 330/261
(58) Field of Classification Search .................... 330/69, 330/255, 260, 261
See application file for complete search history.

(56) References Cited

U.S. PATENT DOCUMENTS

| | | | |
|---|---|---|---|
| 6,366,167 B1 | 4/2002 | Stockstad | |
| 7,209,005 B2 * | 4/2007 | Martins | 330/255 |
| 7,535,302 B2 * | 5/2009 | Nishimura et al. | 330/255 |
| 7,724,088 B2 * | 5/2010 | Adachi | 330/255 |
| 7,760,022 B2 * | 7/2010 | Yamada | 330/255 |
| 2007/0285164 A1 | 12/2007 | Adachi | |
| 2009/0102558 A1 | 4/2009 | Adachi | |

FOREIGN PATENT DOCUMENTS

| | | |
|---|---|---|
| JP | 2001-274642 | 10/2001 |
| JP | 2007-267016 | 10/2007 |
| JP | 2009-105635 | 5/2009 |

* cited by examiner

*Primary Examiner* — Henry Choe
(74) *Attorney, Agent, or Firm* — Cooper & Dunham LLP (57) ABSTRACT

A multi-stage amplification type class-AB operational amplifier disclosed includes an amplification stage having plural amplification sections formed in multiple stages, and a class-AB output stage having a bias section and an output section, in which an input signal input to the amplification stage is sequentially amplified by the plural amplification sections, and further amplified by the bias section and the output section of the class-AB output stage. A positive supply voltage applied to the amplification stage is different from a positive supply voltage applied to the class-AB output stage, and a negative supply voltage applied to the amplification stage is different from a negative supply voltage applied to the class-AB output stage.

16 Claims, 5 Drawing Sheets

OPERATIONAL AMPLIFIER

CROSS-REFERENCE TO RELATED APPLICATIONS

The present application claims priority under 35 U.S.C §119 based on Japanese Patent Application No. 2009-210671 filed Sep. 11, 2009, the entire contents of which are hereby incorporated herein by reference.

BACKGROUND OF THE INVENTION

1. Field of the Invention

The present invention generally relates to an operational amplifier operating at a low voltage.

2. Description of the Related Art

Recently, there has been a demand for a higher SNR (signal-to-noise ratio), lower distortion characteristics, and operability with lower power consumption as the features of the operational amplifiers (driver amplifiers) driving a low load such as a headphone, a speaker and the like. An object of this demand is to extend the voice (music) playback time as much as possible with a small battery.

Figure 4:
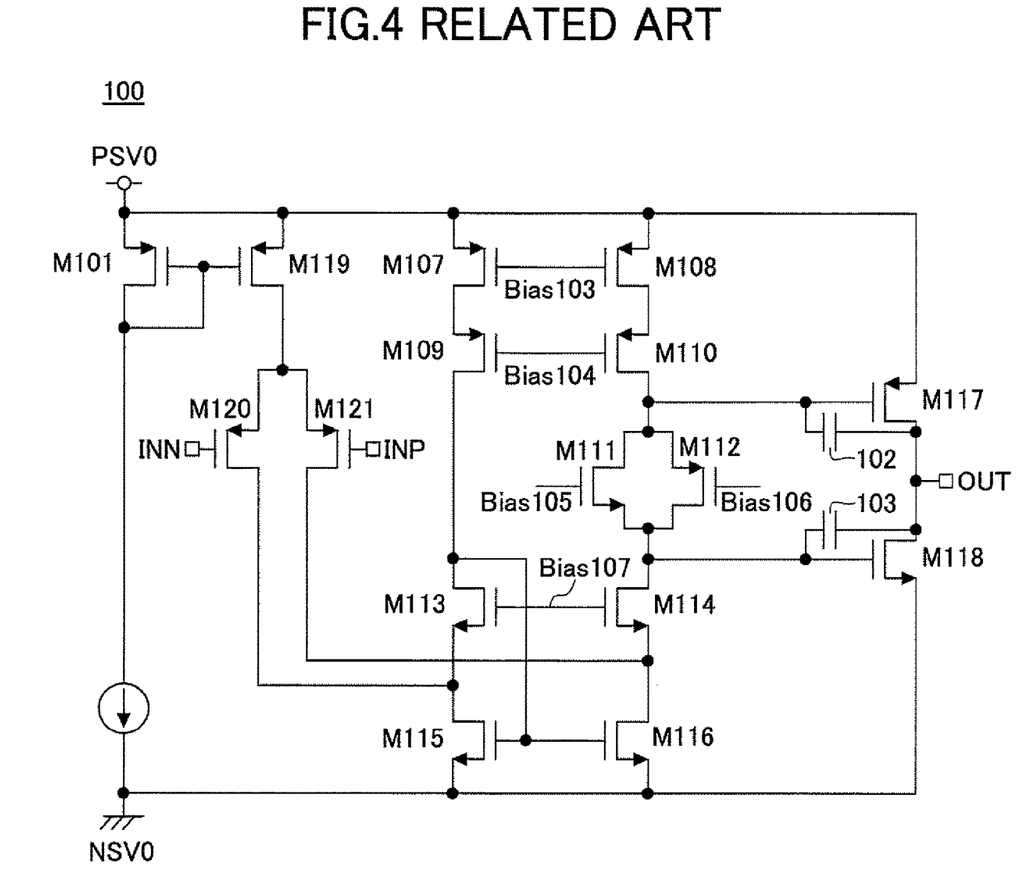
FIG. 4 is a circuit diagram of a conventional folded-cascode-type class-AB operational amplifier.

As an example of an operational amplifier having a higher SNR and lower distortion characteristics, there is a folded-cascode-type class-AB operational amplifier 100 as illustrated in FIG. 4. As illustrated in FIG. 4, the folded-cascode-type class-AB operational amplifier 100 includes:
(1) a current source section having a positive supply voltage PSV0, a negative supply voltage NSV0, and p-channel MOS transistors M101 and M119;
(2) a differential stage having p-channel MOS transistors M120 and M121;
(3) a first cascode connection stage having p-channel MOS transistors M107, M108, M109, and M110;
(4) a second cascode connection stage having re-channel MOS transistors M113, M114, M115, and M116;
(5) an output stage having an n-channel MOS transistor M111, a p-channel MOS transistor M112, a p-channel MOS transistor M117, and an n-channel MOS transistor M118, and capacitor 102 and 103. Input signals input to the non-inverting input terminal INP and the inverting input terminal INN of this folded-cascode-type class-AB operational amplifier 100 are amplified by the first cascode connection stage and the second cascode connection stage, and output as an output signal OUT from the output stage.

In the circuit of FIG. 4, a bias voltage Bias 103 is applied to the gates of the p-channel MOS transistors M107 and M108. A bias voltage Bias 104 is applied to the gates of the p-channel MOS transistors M109 and M110. A bias voltage Bias 107 is applied to the gates of the n-channel MOS transistors M113 and M114. A bias voltage Bias 105 is applied to the gate of the n-channel MOS transistor M111. A bias voltage Bias 106 is applied to the gate of the p-channel MOS transistor M112. Further, the gates of the n-channel MOS transistors M115 and M116 are connected to each other, and further connected to the drain of the n-channel MOS transistors M113.

Generally, the folded-cascode-type class-AB operational amplifiers as illustrated in FIG. 4 have a higher SNR and lower distortion characteristics. However, in the folded-cascode-type class-AB operational amplifiers, there are four or more CMOS transistors connected between the positive supply voltage and the negative supply voltage. Because of this feature, it may become difficult to stably operate at a low saturation voltage. Due to this difficulty, the folded-cascode-type class-AB operational amplifiers may not operate stably.

Figure 5:
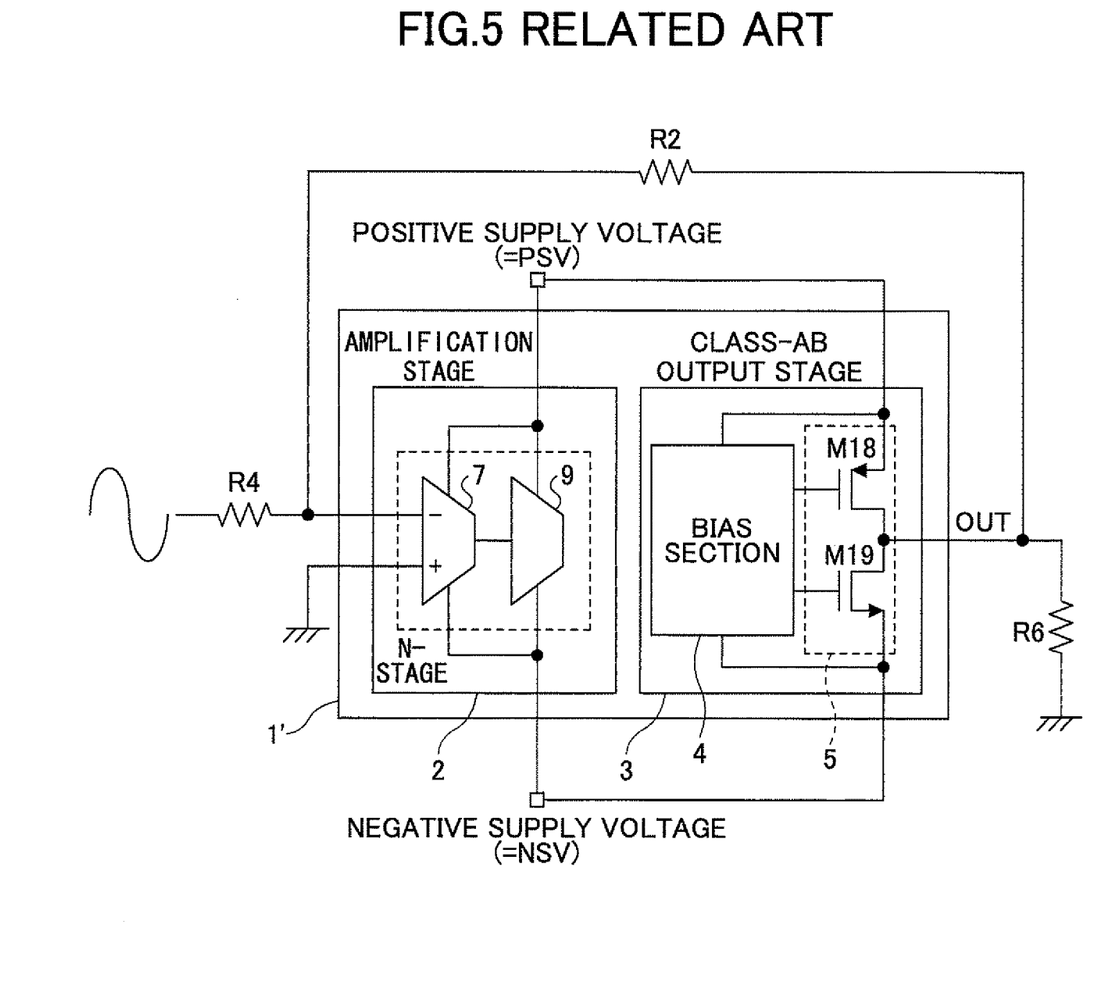
FIG. 5 is a schematic circuit diagram of a conventional multi-stage amplification type class-AB operational amplifier.

On the other hand, as an example of an operational amplifier operating at a lower voltage, there is a multi-stage amplification type class-AB operational amplifier 1' as illustrated in FIG. 5. As illustrated in FIG. 5, the multi-stage amplification type class-AB operational amplifier 1' includes an amplification stage 2 and a class-AB output stage 3. The amplification stage 2 includes multi-stage (N-stage) amplification sections 7 and 9. The class-AB output stage 3 includes a bias section 4 and an output section 5. The output voltage from the output section 5 is applied to the inverting input terminal (−) of the amplification section 7 (the first-stage amplification section) via a resistor R2.

The multi-stage amplification type class-AB operational amplifier 1' illustrated in FIG. 5 has the multi-stage amplification sections 7 and 9. Because of this feature, when compared with the folded-cascode-type class-AB operational amplifier 100, the multi-stage amplification type class-AB operational amplifier 1' may stably operate at a lower voltage. On the other hand, to further reduce the power consumption of the multi-stage amplification type class-AB operational amplifier 1', the class-AB output stage 3 is required to operate at a minimum voltage.

It is known that the current most consumed in the driver amplifier (operational amplifier) to drive a low load such as a headphone, a speaker or the like is the current in the output section 5 of the class-AB output stage 3. Because of this feature, the power consumption may be greatly reduced when it is possible to operate the output section 5 at the minimum voltages of the absolute values of the positive supply voltage and the negative supply voltage. The output section 5 includes a p-channel MOS transistor M18 and an n-channel MOS transistor M19. Therefore, when the minimum voltages of the positive supply voltage and the negative supply voltage in accordance with the output signal level are given, a stable operation may be achieved. However, even though there is no cascode connection in the amplification stage 2, there are two or more CMOS transistors connected between the positive supply voltage and the negative supply voltage. Because of this feature, it may still be difficult to operate at the minimum voltages of the positive supply voltage and the negative supply voltage.

Further, in the multi-stage amplification type class-AB operational amplifier 1' of FIG. 5, due to the current consumed in the output section 5 and the impedance of the positive supply voltage and the negative supply voltage, voltage drops of the positive supply voltage and the negative supply voltage occur in accordance with the output signal level. When the voltage drops of the positive supply voltage and the negative supply voltage occur in accordance with the output signal level, it may become difficult for the amplification stage 2 to operate stably. As a result, it may become difficult for the multi-stage amplification type class-AB operational amplifier 1' to achieve the higher SNR or the lower distortion characteristics.

Japanese Patent Application Publication No. 2007-267016 discloses a cascode-type class-AB operational amplifier providing a higher stable gain even when the supply voltage is lowered.

Further, Japanese Patent Application Publication No. 2001-274642 discloses a low-voltage rail-to-rail CMOS input stage.

SUMMARY OF THE INVENTION

According to an aspect of the present invention, a multi-stage amplification type class-AB operational amplifier includes an amplification stage and a class-AB output stage.

In this configuration, the amplification stage may stably operate, and the class-AB output stage may operate at a minimum positive supply voltage and at a minimum negative supply voltage in accordance with the output signal level.

Further, according to an aspect of the present invention, a multi-stage amplification type class-AB operational amplifier includes an amplification stage having plural amplification sections formed in multiple stages, and a class-AB output stage having a bias section and an output section. Further, an input signal input to the amplification stage is sequentially amplified by the plural amplification sections, and further amplified by the bias section and the output section of the class-AB output stage; a positive supply voltage applied to the amplification stage is different from a positive supply voltage applied to the class-AB output stage, and a negative supply voltage applied to the amplification stage is different from a negative supply voltage applied to the class-AB output stage.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

First Embodiment

1. Multi-Stage Amplification Type Class-AB Operational Amplifier

Figure 1:
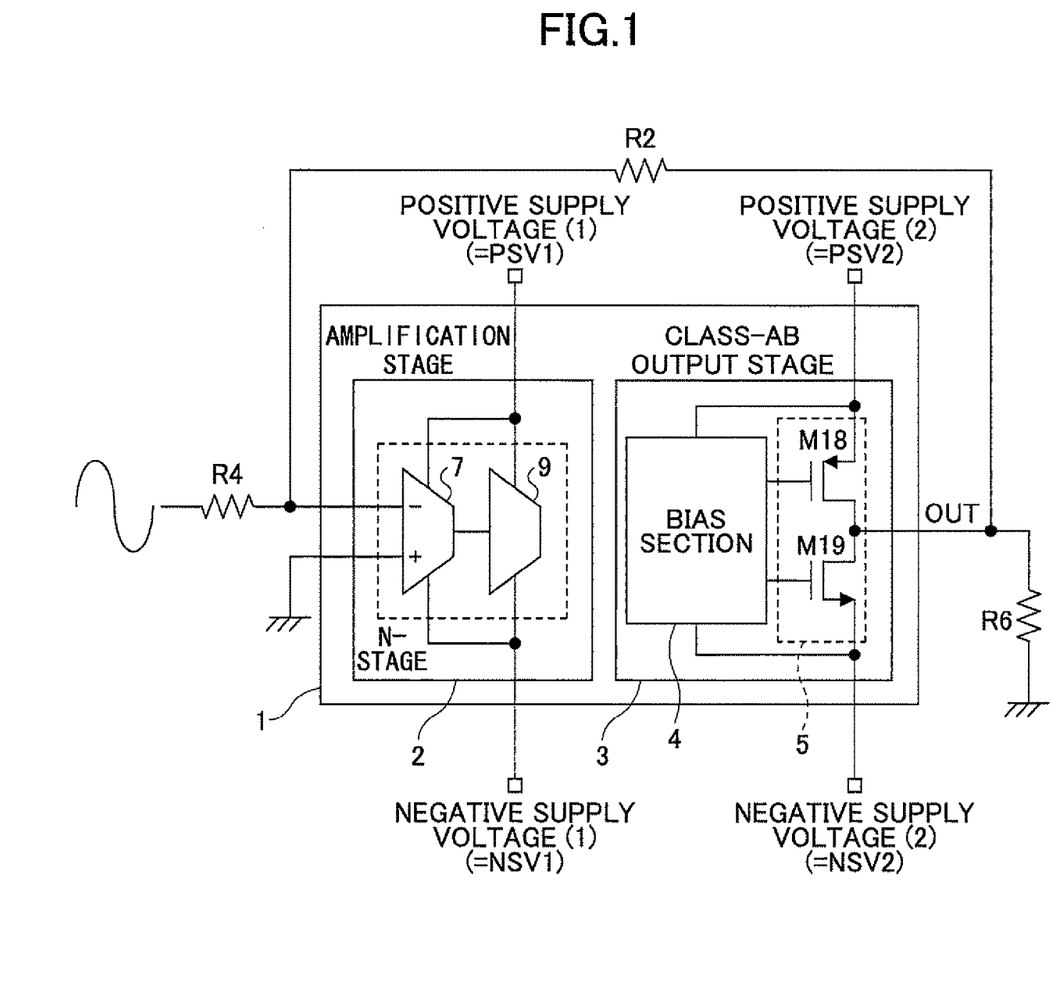
FIG. 1 is schematic circuit diagram of a multi-stage amplification type class-AB operational amplifier according to a first embodiment of the present invention.

FIG. 1 is a schematic circuit diagram of a multi-stage amplification type class-AB operational amplifier 1 according to a first embodiment of the present invention. As illustrated in FIG. 1, the multi-stage amplification type class-AB operational amplifier 1 includes an amplification stage 2 and a class-AB output stage 3. The amplification stage 2 amplifies an input signal. The class-AB output stage 3 outputs a class-AB signal.

The amplification stage 2 includes multi-stage (plural) amplification sections. The amplification stage 2 of FIG. 1 includes two stages of the amplification sections (i.e., a first amplification section 7 and a second amplification section 9). The class-AB output stage 3 includes a bias section 4 and an output section 5. The output section 5 includes a push-pull circuit having a p-channel MOS transistor M18 and an n-channel MOS transistor M19. The bias section 4 is connected to the gates of the p-channel MOS transistor M18 and the n-channel MOS transistor M19, so that the bias section 4 determines the currents for the p-channel MOS transistor M18 and the n-channel MOS transistor M19 in steady state.

The first amplification section 7 of the amplification stage 2 has a non-inverting input terminal (+) and an inverting input terminal (−). The output from the output section 5 is input to the inverting input terminal (−) via a resistor element R2.

In the multi-stage amplification type class-AB operational amplifier 1 of FIG. 1, input signals input to the non-inverting input terminal (+:INP) and the inverting input terminal (−:INN) (of the first amplification section 7) of the amplification stage 2 are sequentially amplified by the first amplification section 7 and the second amplification section 9, and output as an output signal "OUT" from the output section 5 of the class-AB output stage 3. In this case, to amplify the signal output from the output section 5, the voltages are applied from the bias section 4 to the gates of the p-channel MOS transistor M18 and the n-channel MOS transistor M19 of the output section 5.

As illustrated in FIG. 1, in the multi-stage amplification type class-AB operational amplifier 1 according to this embodiment of the present invention, a positive supply voltage and a negative supply voltage of the amplification stage 2 and a positive supply voltage and a negative supply voltage, respectively, of the class-AB output stage 3 are separated from each other as different supply voltages. Further, when the positive supply voltage and the negative supply voltage of the amplification stage 2 are expressed as PSV1 (Positive Supply Voltage 1) and NSV1 (Negative Supply Voltage 1), respectively, and the positive supply voltage and the negative supply voltage of the class-AB output stage 3 are expressed as PSV2 (Positive Supply Voltage 2) and NSV2 (Negative Supply Voltage 2), respectively, the voltages are set so that the following relationships are satisfied.

$$|PSV1| \geqq |PSV2| \tag{1A}$$

$$|NSV1| \geqq |NSV2| \tag{1B}$$

By using separate supply voltages between the amplification stage 2 and the class-AB output stage 3 and setting the voltages so that the above relations (i.e., (1A) and (1B)) are satisfied, stable amplification of the amplification stage 2 regardless of the output signal level may be performed. Further, the class-AB output stage 3 may operate at the minimum positive supply voltage and at the minimum negative supply voltage. As a result, the power consumption of the entire operational amplifier may be greatly reduced. In this case, preferably, the positive supply voltage and the negative supply voltage applied to the class-AB output stage 3 be in accordance with the output signal level.

As long as the above relationships (1A) and (1B) are satisfied, the positive supply voltage and the negative supply voltage of the amplification stage 2 and the positive supply voltage and the negative supply voltage of the class-AB output stage 3 may be separately set.

For example, first, PSV1, NSV1, PSV2, and NSV2 may be fixed voltages.

Otherwise, PSV1 and NSV1 may be variable voltages based on external signal control, and PSV2 and NSV2 may be fixed voltages.

On the contrary, PSV1 and NSV1 may be fixed voltages, and PSV2 and NSV2 may be variable voltages based on external signal control.

Further, PSV1, NSV1, PSV2, and NSV2 may variable voltages based on external signal control. In this case, a control signal to control PSV1 and NSV1 may be the same as or different from a control signal to control PSV2 and NSV2.

Further, among PSV1, NSV1, PSV2, and NSV2, PSV1 and PSV2 may be based on the same supply voltage (i.e., PSV1=PSV2). As the same supply voltage, the fixed voltage or the variable voltage based on external signal control may be used. In this case, NSV1 and NSV2 may have one of the following four relations (Relations (1) through (4)) (see Table 1 below) provided that the relation |NSV1|≧|NSV2| is satisfied.

TABLE 1

|  | NSV1 | NSV2 |
| --- | --- | --- |
| Relation (1) | Fixed voltage | Fixed voltage |
| Relation (2) | Fixed voltage | Variable voltage based on external signal control |
| Relation (3) | Variable voltage based on external signal control | Fixed voltage |
| Relation (4) | Variable voltage based on external signal control | Variable voltage based on external signal control |

In relation (4), the control signal controlling NSV1 may be the same as or different from the control signal controlling NSV2.

Further, among PSV1, NSV1, PSV2, and NSV2, NSV1 and NSV2 may be based on the same supply voltage (i.e., NSV1=NSV2). As the same supply voltage, the fixed voltage or the variable voltage based on external signal control may be used. In this case, PSV1 and PSV2 may have one of the following four relations (Relations (5) through (8)) (see Table 2 below) provided that the relation |PSV1|≧|PSV2| is satisfied.

TABLE 2

|  | PSV1 | PSV2 |
| --- | --- | --- |
| Relation (5) | Fixed voltage | Fixed voltage |
| Relation (6) | Fixed voltage | Variable voltage based on external signal control |
| Relation (7) | Variable voltage based on external signal control | Fixed voltage |
| Relation (8) | Variable voltage based on external signal control | Variable voltage based on external signal control |

In relation (8), the control signal controlling PSV1 may be the same as or different from the control signal controlling PSV2.

2.1. Specific Circuit Diagram of Multi-Stage Amplification Type Class-AB Operational Amplifier FIG. 2 illustrates a specific example of a circuit diagram of the multi-stage amplification type class-AB operational amplifier of FIG. 1.

Figure 2:
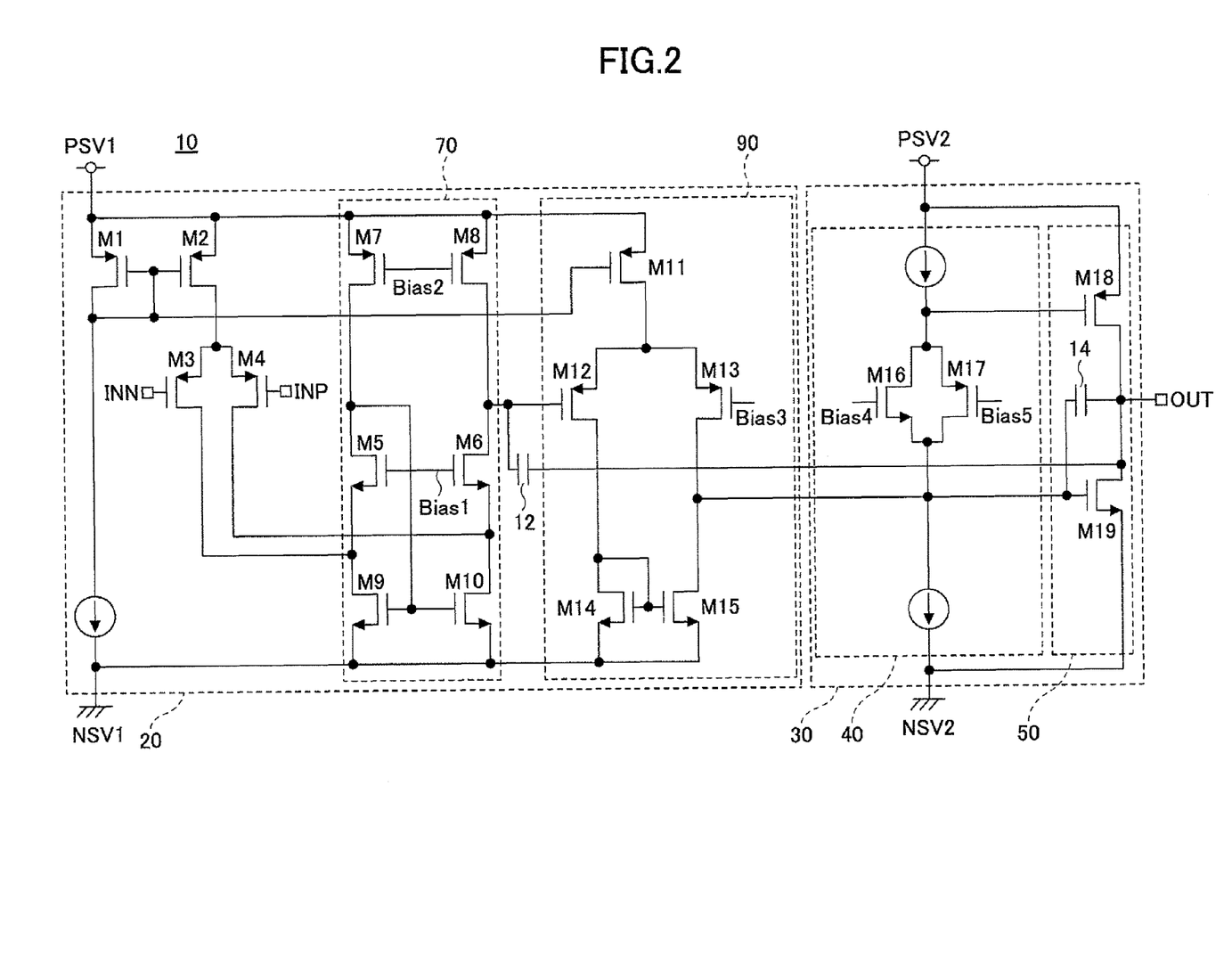
FIG. 2 is an exemplary specific circuit diagram of the multi-stage amplification type class-AB operational amplifier in FIG. 1.

As illustrated in FIG. 2, a multi-stage amplification type class-AB operational amplifier 10 includes an amplification stage 20 and a class-AB output stage 30. The amplification stage 20 includes two stages, a first amplification stage 70 and a second amplification stage 90. The class-AB output stage 30 includes a bias section 40 and an output section 50. A positive supply voltage PSV1 and a negative supply voltage NSV1 are applied to the amplification stage 20. A positive supply voltage PSV2 and a negative supply voltage NSV2 are applied to the class-AB output stage 30. In this case, the positive supply voltage PSV2 and the negative supply voltage NSV2 applied to the class-AB output stage 30 are different from the positive supply voltage PSV1 and a negative supply voltage NSV1, respectively, applied to the amplification stage 20.

Next, a more detailed configuration of the multi-stage amplification type class-AB operational amplifier 10 is described.

The amplification stage 20 of the multi-stage amplification type class-AB operational amplifier 10 includes:

(A) a current source section having the positive supply voltage PSV1, the negative supply voltage NSV1, and p-channel MOS transistors M1 and M2;

(B) a differential stage having p-channel MOS transistors M3 and M4;

(C) the first amplification stage 70 having p-channel MOS transistors M7 and M8, and n-channel MOS transistors M5, M6, M9, and M10; and (D) the second amplification stage 90 having a p-channel MOS transistor M11 serving as a current source, p-channel MOS transistors M12 and M13, and re-channel MOS transistors M14 and M15. Input signals are input to the non-inverting input terminal INP and the inverting input terminal INN (FIG. 2).

The bias section 40 of the multi-stage amplification type class-AB operational amplifier 10 in FIG. 2 includes the positive supply voltage PSV2, the negative supply voltage NSV2, an n-channel MOS transistor M16, and a p-channel MOS transistors M17. The drain of the n-channel MOS transistor M16 and the source of the p-channel MOS transistors M17 are connected to each other. Further, the source of the n-channel MOS transistor M16 and the drain of the p-channel MOS transistors M17 are connected to each other.

The output section 50 of the multi-stage amplification type class-AB operational amplifier 10 in FIG. 2 includes the positive supply voltage PSV2, the negative supply voltage NSV2, a p-channel MOS transistor M18, an n-channel MOS transistor M19, and capacitors 12 and 14. As described above, the p-channel MOS transistor M18 and the n-channel MOS transistor M19 form a push-pull circuit.

In the circuit diagram of FIG. 2, a bias voltage Bias 2 is applied to the gates of the p-channel MOS transistors M7 and M8. A bias voltage Bias 1 is applied to the gates of the n-channel MOS transistors M5 and M6. A bias voltage Bias 3 is applied to the gate of the p-channel MOS transistor M13. A bias voltage Bias 4 is applied to the gate of the n-channel MOS transistor M16. A bias voltage Bias 5 is applied to the gate of the p-channel MOS transistor M17. Further, the gates of the p-channel MOS transistors M1 and M2 are connected to each other and are further connected to the drain of the p-channel MOS transistor M1 and the gate of the re-channel MOS transistor M11. The gates of the n-channel MOS transistors M9 and M10 are connected to each other, and are further connected to the drain of the n-channel MOS transistor M5. The gates of the re-channel MOS transistors M14 and M15 are connected to each other, and are further connected to the drain of the n-channel MOS transistor M14.

The drain of the p-channel MOS transistor M8 and the drain of the n-channel MOS transistor M6 are connected to each other, and are further connected to the gate of the p-channel MOS transistor M12, the drain of the p-channel MOS transistor M18 (via the capacitor 12), and the drain of the n-channel MOS transistor M19. The drain of the p-channel MOS transistor M13 and the drain of the n-channel MOS transistor M15 are connected to each other, and are further connected to the source of the n-channel MOS transistor M16, the drain of the p-channel MOS transistor M17, the gate of the n-channel MOS transistor M19, and an output signal "OUT" (via the capacitor 14).

As the bias voltages Bias 1, Bias 2, and Bias 3 in the amplification stage 20, appropriate voltages are applied so that all the CMOS transistors in the amplification stage 20 operate in their saturation regions. The CMOS transistor sizes in the amplification stage 20 may be adjusted so as to satisfy the characteristics required for the multi-stage operational amplifier, the characteristics including a higher SNR, lower distortion, and lower current consumption.

In the multi-stage amplification type class-AB operational amplifier 10, the positive supply voltage PSV1 and the negative supply voltage NSV1 in the amplification stage 20 are not influenced by the positive supply voltage PSV2 and the negative supply voltage NSV2. Because of this feature, the amplification stage 20 may always operate stably.

Further, in the bias section 40, the drain of the n-channel MOS transistor M16 and the source of the p-channel MOS transistor M17 are connected to each other, and are further connected to the gate of the p-channel MOS transistor M18. The source of the n-channel MOS transistor M16 and the drain of the p-channel MOS transistor M17 are connected to each other, and are further connected to the gate of the n-channel MOS transistor M19. By having this configuration, the bias section 40 determines the currents of the p-channel MOS transistor M18 and the n-channel MOS transistor M19 in steady state. Namely, when no signal is output, the gate voltage of the n-channel MOS transistor M19 of the output section 50 is determined based on the n-channel MOS transistor M16 having the gate to which the bias voltage Bias 4 is applied in the bias section 40, and the gate voltage of the p-channel MOS transistor M18 of the output section 50 is determined based on the p-channel MOS transistor M17 having the gate to which the bias voltage Bias 5 is applied in the bias section 40.

Further, when a signal is output, due to the current that flows through an external load and that varies in accordance with the output signal level, the gate voltage of the n-channel MOS transistor M19 of the output section 50 of the class-AB output stage 30 is increased, and the gate voltage of the p-channel MOS transistor M18 is decreased. In this case, as described above, the positive supply voltage PSV2 and the negative supply voltage NSV2 which are different from the positive supply voltage PSV1 and a negative supply voltage NSV1, respectively, applied to the amplification stage 20 are applied to the class-AB output stage 30. Because of this feature, an influence from the amplification stage 20 due to the voltage fluctuation caused by the current flowing in the output section 50 in accordance to the output signal and the impedance of the positive supply voltage PSV2 and the negative supply voltage NSV2 may be reduced. As a result, in the class-AB output stage 30, stable characteristics and operations may be achieved. Further, even when the positive supply voltage PSV2 and the negative supply voltage NSV2 fluctuate, the class-AB output stage 30 may stably operate.

Figure 3A:
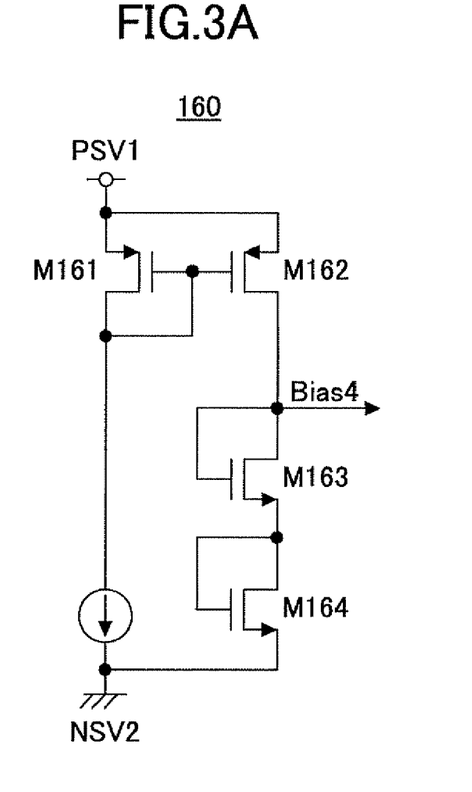
FIG. 3A is an exemplary circuit diagram of a first generation circuit generating a gate voltage Bias 4 of a bias section in FIG. 2.

2.2. Gate Voltage Generation Circuits in Bias Section 40 of Multi-Stage Amplification Type Class-AB Operational Amplifier It is preferable that the gate voltages Bias 4 and Bias 5 in the bias section 40 of multi-stage amplification type class-AB operational amplifier in FIG. 2 or 1 be stably generated. FIG. 3A illustrates a first generation circuit 160 generating the gate voltage Bias 4 in the bias section 40. As illustrated in FIG. 3A, the first generation circuit 160 includes a p-channel MOS transistor M161, a p-channel MOS transistor M162, an n-channel MOS transistor M163, and an n-channel MOS transistor M164. The p-channel MOS transistor M161 forms a current mirror circuit with the p-channel MOS transistor M162.

In the first generation circuit 160 of FIG. 3A, NSV2 is connected as the negative supply voltage. However, as the positive supply voltage, PSV1 of the amplification stage 20 is connected. By being connected to the positive supply voltage PSV1 of the amplification stage 20, the p-channel MOS transistor M162 in the first generation circuit 160 may stably operate.

Figure 3B:
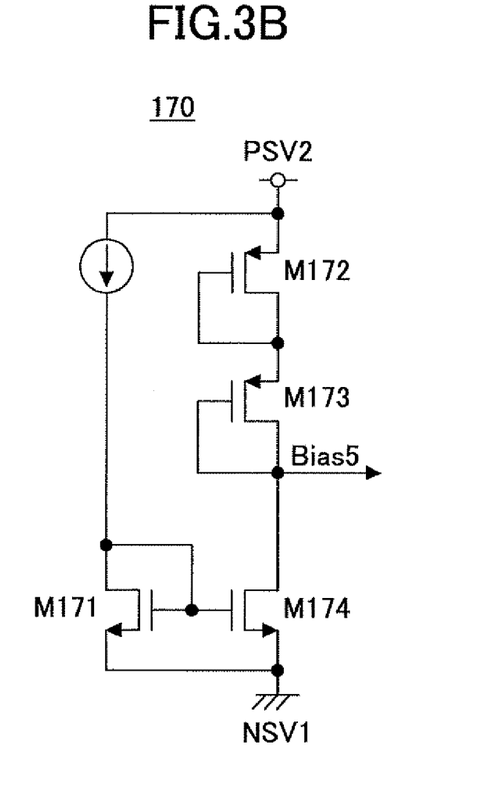
FIG. 3B is an exemplary circuit diagram of a second generation circuit generating a gate voltage Bias 5 of the bias section in FIG. 2.

Next, FIG. 3B illustrates a second generation circuit 170 generating the gate voltage Bias 5 in the bias section 40. As illustrated in FIG. 3B, the second generation circuit 170 includes an re-channel MOS transistor M171, an n-channel MOS transistor M174, a p-channel MOS transistor M173, and a p-channel MOS transistor M172.

In the second generation circuit 170 of FIG. 3B, PSV2 is connected as the positive supply voltage. However, as the negative supply voltage, NSV1 of the amplification stage 20 is connected. By being connected to the negative supply voltage NSV1 of the amplification stage 20, the n-channel MOS transistor M174 in the second generation circuit 170 may stably operate.

According to an embodiment of the present invention, a multi-stage amplification type class-AB operational amplifier includes an amplification stage having plural amplification sections formed in multiple stages, and a class-AB output stage having a bias section and an output section. Further, an input signal input to the amplification stage is sequentially amplified by the plural amplification sections, and further amplified by the bias section and the output section of the class-AB output stage, a positive supply voltage applied to the amplification stage is different from a positive supply voltage applied to the class-AB output stage, and a negative supply voltage applied to the amplification stage is different from a negative supply voltage applied to the class-AB output stage.

Preferably, the positive supply voltage applied to the amplification stage be equal to or greater than the positive supply voltage applied to the class-AB output stage, and the negative supply voltage applied to the amplification stage be equal to or less than the negative supply voltage applied to the class-AB output stage.

According to an embodiment of the present invention, a multi-stage amplification type class-AB operational amplifier includes an amplification stage having plural amplification sections formed in multiple stages, and a class-AB output stage having a bias section and an output section. Further, an input signal input to the amplification stage is sequentially amplified by the plural amplification sections, and further amplified by the bias section and the output section of the class-AB output stage, and a positive supply voltage applied to the amplification stage is different from a positive supply voltage applied to the class-AB output stage.

Preferably, the positive supply voltage applied to the amplification stage be equal to or greater than the positive supply voltage applied to the class-AB output stage.

According to an embodiment of the present invention, a multi-stage amplification type class-AB operational amplifier includes an amplification stage having plural amplification sections formed in multiple stages, and a class-AB output stage having a bias section and an output section. Further, an input signal input to the amplification stage is sequentially amplified by the plural amplification sections and further amplified by the bias section and the output section of the class-AB output stage, and a negative supply voltage applied to the amplification stage is different from a negative supply voltage applied to the class-AB output stage.

Preferably, the negative supply voltage applied to the amplification stage be equal to or less than the negative supply voltage applied to the class-AB output stage.

By using a multi-stage amplification type class-AB operational amplifier according to an embodiment of the present invention, the amplification stage may stably operate regardless of the output signal level, and the class-AB output stage may operate based on the minimum positive supply voltage and the minimum negative supply voltage in accordance with the output signal level. As a result, in the multi-stage amplification type class-AB operational amplifier, a higher SNR, lower distortion characteristics, and lower current consumption may be achieved.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A multi-stage amplification type class-AB operational amplifier comprising:
    an amplification stage having plural amplification sections formed in multiple stages; and
    a class-AB output stage having a bias section and an output section, wherein
    an input signal input to the amplification stage is sequentially amplified by the plural amplification sections, and further amplified by the bias section and the output section of the class-AB output stage,
    a positive supply voltage applied to the amplification stage is different from a positive supply voltage applied to the class-AB output stage,
    a negative supply voltage applied to the amplification stage is different from a negative supply voltage applied to the class-AB output stage,
    the positive supply voltage applied to the amplification stage is equal to or greater than the positive supply voltage applied to the class-AB output stage, and
    the negative supply voltage applied to the amplification stage is equal to or less than the negative supply voltage applied to the class-AB output stage.

2. The multi-stage amplification type class-AB operational amplifier according to claim 1, wherein
    the bias section is formed in a manner such that a drain of an n-channel MOS transistor and a source of a p-channel MOS transistor are connected to each other, and a source of the n-channel MOS transistor and a drain of the p-channel MOS transistor are connected to each other, and
    the positive supply voltage applied to the amplification stage is applied to a first generation circuit generating a gate voltage of the n-channel MOS transistor.

3. The multi-stage amplification type class-AB operational amplifier according to claim 1, wherein
    the bias section is formed in a manner such that a drain of an n-channel MOS transistor and a source of a p-channel MOS transistor are connected to each other, and a source of the n-channel MOS transistor and a drain of the p-channel MOS transistor are connected to each other, and
    the negative supply voltage applied to the amplification stage is applied to a second generation circuit generating a gate voltage of the p-channel MOS transistor.

4. The multi-stage amplification type class-AB operational amplifier according to claim 1, wherein
    the positive supply voltage applied to the amplification stage, the positive supply voltage applied to the class-AB output stage, the negative supply voltage applied to the amplification stage, and the negative supply voltage applied to the class-AB output stage are fixed voltages.

5. The multi-stage amplification type class-AB operational amplifier according to claim 1, wherein
    the positive supply voltage and the negative supply voltage applied to the amplification stage are one of variable voltages based on external signal control and fixed voltages, and the positive supply voltage and the negative supply voltage applied to the class-AB output stage are the other one of the variable voltages based on external signal control and the fixed voltages.

6. The multi-stage amplification type class-AB operational amplifier according to claim 1, wherein
    the positive supply voltage applied to the amplification stage, the positive supply voltage applied to the class-AB output stage, the negative supply voltage applied to the amplification stage, and the negative supply voltage applied to the class-AB output stage are variable voltages based on external signal control, and
    a control signal controlling the positive supply voltage and the negative supply voltage applied to the amplification stage is a same as or different from a control signal controlling the positive supply voltage and the negative supply voltage applied to the class-AB output stage.

7. A multi-stage amplification type class-AB operational amplifier comprising:
    an amplification stage having plural amplification sections formed in multiple stages; and
    a class-AB output stage having a bias section and an output section, wherein
    an input signal input to the amplification stage is sequentially amplified by the plural amplification sections, and further amplified by the bias section and the output section of the class-AB output stage,
    a positive supply voltage applied to the amplification stage is different from a positive supply voltage applied to the class-AB output stage, and
    the positive supply voltage applied to the amplification stage is equal to or greater than the positive supply voltage a shed to the class-AB output stage.

8. The multi-stage amplification type class-AB operational amplifier according to claim 7, wherein
    the bias section is formed in a manner such that a drain of an n-channel MOS transistor and a source of a p-channel MOS transistor are connected to each other, and a source of the n-channel MOS transistor and a drain of the p-channel MOS transistor are connected to each other, and
    the positive supply voltage applied to the amplification stage is applied to a first generation circuit generating a gate voltage of the n-channel MOS transistor.

9. The multi-stage amplification type class-AB operational amplifier according to claim 7, wherein
    a negative supply voltage applied to the amplification stage and a negative supply voltage applied to the class-AB output stage are one fixed voltage, and the positive supply voltage applied to the amplification stage and the positive supply voltage applied to the class-AB output stage are fixed voltages.

10. The multi-stage amplification type class-AB operational amplifier according to claim 7, wherein
    the positive supply voltage applied to the amplification stage is one of a variable voltage based on external signal control and a fixed voltage, and the positive supply voltage applied to the class-AB output stage is the other one of the variable voltage based on external signal control and the fixed voltage.

11. The multi-stage amplification type class-AB operational amplifier according to claim 7, wherein
the positive supply voltage applied to the amplification stage and the positive supply voltage applied to the class-AB output stage are variable voltages based on external signal control, and
a control signal controlling the positive supply voltage applied to the amplification stage is a same as or different from a control signal controlling the positive supply voltage applied to the class-AB output stage.

12. A multi-stage amplification type class-AB operational amplifier comprising:
an amplification stage having plural amplification sections formed in multiple stages; and
a class-AB output stage having a bias section and an output section, wherein an input signal input to the amplification stage is sequentially amplified by the plural amplification sections and further amplified by the bias section and the output section of the class-AB output stage,
a negative supply voltage applied to the amplification stage is different from a negative supply voltage applied to the class-AB output stage, and
the negative supply voltage applied to the amplification stage is equal to or than the negative supply voltage applied to the class-AB output stage.

13. The multi-stage amplification type class-AB operational amplifier according to claim 12, wherein
the bias section is formed in a manner such that a drain of an n-channel MOS transistor and a source of a p-channel MOS transistor are connected to each other, and a source of the n-channel MOS transistor and a drain of the p-channel MOS transistor are connected to each other, and
the negative supply voltage applied to the amplification stage is applied to a second generation circuit generating a gate voltage of the p-channel MOS transistor.

14. The multi-stage amplification type class-AB operational amplifier according to claim 12, wherein
a positive supply voltage applied to the amplification stage and a positive supply voltage applied to the class-AB output stage are one fixed voltage, and the negative supply voltage applied to the amplification stage and the negative supply voltage applied to the class-AB output stage are fixed voltages.

15. The multi-stage amplification type class-AB operational amplifier according to claim 12, wherein
the negative supply voltage applied to the amplification stage is one of a variable voltage based on external signal control and a fixed voltage, and the negative supply voltage applied to the class-AB output stage is the other one of the variable voltage based on external signal control and the fixed voltage.

16. The multi-stage amplification type class-AB operational amplifier according to claim 12, wherein
the negative supply voltage applied to the amplification stage and the negative supply voltage applied to the class-AB output stage are variable voltages based on external signal control, and
a control signal controlling the negative supply voltage applied to the amplification stage is a same as or different from a control signal controlling the negative supply voltage applied to the class-AB output stage.

* * * * *